United States Patent [19]

Darmon et al.

[11] Patent Number: 5,056,105
[45] Date of Patent: Oct. 8, 1991

[54] INTERLEAVING METHOD FOR A DIGITAL TRANSMISSION SYSTEM

[75] Inventors: Marc Darmon; Philippe Sadot, both of Paris; Sami Harari, Levallois Perret, all of France

[73] Assignee: Alcatel Transmission par Faisceaux Hertziens, Levallois Perret Cedex, France

[21] Appl. No.: 438,380

[22] Filed: Nov. 20, 1989

[30] Foreign Application Priority Data

Nov. 25, 1988 [FR] France ................... 88 15422

[51] Int. Cl.$^5$ .................. H04L 27/30; H03M 7/00
[52] U.S. Cl. ........................... 375/1; 341/81; 371/2.1
[58] Field of Search ........... 375/1; 380/34; 371/2.1, 371/37.5, 44

[56] References Cited

U.S. PATENT DOCUMENTS

| | | | |
|---|---|---|---|
| 4,394,642 | 7/1983 | Currie et al. | 371/40 |
| 4,547,887 | 10/1985 | Gui | 375/1 |
| 4,559,625 | 12/1985 | Berlekamp et al. | 371/2.1 |
| 4,759,034 | 7/1988 | Nagazumi | 375/1 |
| 4,852,102 | 7/1989 | Yamaguchi | 371/2.1 |

FOREIGN PATENT DOCUMENTS

| | | |
|---|---|---|
| 0232043 | 8/1987 | European Pat. Off. . |
| 0235477 | 9/1987 | European Pat. Off. . |
| 2240057 | 2/1974 | Fed. Rep. of Germany . |
| 2486680 | 1/1982 | France . |

OTHER PUBLICATIONS

IEEE International Conference on Communications, vol. 1, Jun. 19, 1983, Boston, Massachusetts, pp. 509–513; S. Y. Mui, "The Performance of Pseudorandum Interleaving in Conjunction with Viterby Decoding of convolutional Codes".

National Telecommunications Conference-NTC, vol. 3, Nov. 29, 1979, Washington, DC; J. B. Cain and J. M. Geist: "Interleaving Considerations for Convolutional Coding on Baussian Noise Channels with Burst Erasures", pp. 44.5.1–44.5.5.

Clarck and Cain: "Error Correcting Coding", 1981, Plenum Press, New York, pp. 349–352.

*Primary Examiner*—Bernarr E. Gregory
*Attorney, Agent, or Firm*—Sughrue, Mion, Zinn, Macpeak & Seas

[57] ABSTRACT

A psuedo-random interleaving method suitable for use in transmitting digital data. A pseudo-random pilot sequence is used for simultaneously reading from and writing to a vector of size $Tv \geq Tc \times Lm$, the pilot sequence satisfying a minimum distance law Lm, except when blocking occurs. Deinterleaving is performed symmetrically by means of an inverse pilot sequence suitable for reconstituting successive code words.

2 Claims, 1 Drawing Sheet

INTERLEAVING METHOD FOR A DIGITAL TRANSMISSION SYSTEM

The present invention relates to a pseudo-random interleaving method suitable for use in digital data transmission.

BACKGROUND OF THE INVENTION

In conventional digital transmission systems, as shown in FIG. 1, it is common practice to interleave symbols prior to transmitting them in order to counter the effect of errors occurring in "packets". In a received data train, isolated errors are readily corrected by using error correcting codes encoded by an encoder 10 in the transmitter 11 (and decoded by a decoder 12 in the receiver 13), however such correction is not possible when errors occur in "packets" 14, i.e. in the form of a relatively high number of successive errors since, in such cases, the error correcting capacity of the code is exceeded. A known way of mitigating this drawback when the transmitted data is encoded by means of an error correcting code, is to interleave symbols (using an interleaver 15 in the transmitter 11) after encoding so as to prevent a packet of errors masking several entire words. Thus, by virtue of the interleaving, the symbols of any given word are not bunched together but are spread out over successive words as actually transmitted and are thus transmitted in small correctable bursts 17, such that a packet of errors cannot mask all of the symbols in the same original word (i.e. word as encoded prior to interleaving). Naturally, symbols which are transmitted in this way need to be deinterleaved by a deinterleaver 16 in the receiver 13 on reception, after which they are retransmitted in their proper places within each word. If only a few isolated symbols are erroneous, then the error correcting code can reconstitute the correct word. In FIG. 1, the transmitting antenna is referred to as 18 and the receiving antenna as 19.

A particularly simple known method of interleaving is constituted by matrix interleaving in which symbols are interleaved in accordance with a given law and on a repetitive basis. If each word contains N successive symbols, it may be agreed that the first word as effectively transmitted shall be made up by the sequence of the first symbols in the first N original words (i.e. after the error correcting code has been applied), with the second word actually transmitted being made up by the sequence constituted by the second symbols of said N first words, and the third word by the sequence of third symbols in these N first words, and so on.

This method of interleaving is effective in countering accidental packets of errors, i.e. errors which are not due to deliberate enemy jamming, however its repetitive nature makes it vulnerable to electronic warfare and thus totally ineffective in such circumstances.

In order to counter jamming of the kind that may be used in electronic warfare, one known technique consists in using pseudo-random interleaving. In this case, symbols are not interleaved repetitively, but they are interleaved in a pseudo-random manner so that without knowing the pseudo-random interleaving law applied, it is not possible to locate the various symbols of a given original word within the received message.

The quality of interleaving, whether pseudo-random or otherwise, is measured by the minimum distance Lm that may occur after interleaving between two symbols which were initially consecutive in the same code word. For a code capable of correcting t errors and an estimated jamming length Lc, it is necessary for $Lm > Lc/t$.

One known method of pseudo-random interleaving consists in writing the symbols sequentially into a vector of size M, and then in reading the symbols sequentially from addresses given by $Xn = (Xo + n.p) \bmod M$, where p is prime relative to M. The constants p and Xo are changed for each transmitted vector. For the best values of p that have been found, the separation between two symbols of the same word is half the separation obtained using matrix interleaving, for given delay and equal size of buffer memory. Another drawback of this known method is that it does not give rise to genuinely pseudo-random interleaving.

Another prior art proposal consists in a pseudo-random interleaver constituted by a convolutional interleaver followed by a permutator of length L. The permutations are performed by writing L symbols into a vector and then in reading them from a pseudo-random sequence of addresses. In comparison with a matrix interleaver and for equivalent interleaving (i.e. the same minimum distance between two symbols which were initially consecutive in the original train), this prior interleaver suffers from the drawback of requiring a buffer memory which is twice as large. In addition, this interleaver is not free from periodic behavior. If a particular symbol in a given word is considered, e.g. a frame-synchronizing word, then the position of this symbol in the channel binary train lies within a window of L bits: the method is thus relatively easily jammed by an enemy.

The invention seeks to remedy these drawbacks and, more generally, to obtain high quality interleaving (a large distance after interleaving between the various symbols of a given original word), which is genuinely pseudo-random, which uses buffer memories of reduced size, and which does not require too great a restitution time for comparable parameters.

SUMMARY OF THE INVENTION

These results are obtained by a pseudo-random interleaving method which consists in using a vector whose size Tv is not less than the size Tc of a code word multiplied by the minimum distance Lm (as defined above) desired after interleaving, i.e. $Tv \geq Tc.Lm$, in initially filling this vector with the series S1 of the first Tv symbols of the sequence of code words, then, at each of the addresses of said vector given one after the other by a pseudo-random pilot sequence, taking the symbol from that address to incorporate it into the channel sequence for transmission, and immediately replacing it at said address with the following symbol in code word order taken from the series S2 of the following Tv symbols, until all of the symbols of said first series S1 have been taken one after the other and replaced by all of the symbols of said second series S2, and then in repeating the process, by taking all of the symbols of said second series S2 in the same manner in a pseudo-random order specified by said pilot sequence, replacing each of them in turn in said vector with symbols taken in order from the third series S3 of the following Tv symbols in code word order, and so on until all of the words have been incorporated in said channel sequence.

The pilot sequence is established, pseudo-randomly by obeying the three following laws:

(I) no address in the vector may be selected more than once while transmitting the symbols of a series Sn and replacing them in the vector with the symbols of a series Sn+1;

(II) once one of these addresses n has been selected, any other address in the vector that contains another symbol in the same code word as the code word that contains the symbol found at the address n when said address was selected may not itself be selected until Lm turns later; and (III) if blocking occurs, i.e. if an address cannot be selected without transgressing one or other of the two preceding laws, then an address is selected which does not transgress the first law I, even if it does transgress the second law II.

On reception, the received signal sequence is deinterleaved by using another vector of the same size as the vector used on transmission, said vector being initially filled in successive addresses with the first Tv symbols from the channel sequence in the order in which they are received, after which, in the same manner as at the transmission end, the symbols are simultaneously read from the vector and replaced by the following symbols of the channel sequence at successive addresses given by an inverse pilot sequence determined so that the symbols read in this way one after the other are in the initial order of the encoded symbols before interleaving.

DETAILED DESCRIPTION

In any event, the invention will be well understood and its advantages and other characteristics will appear from reading the following description of two non-limiting examples of interleaving obtained using the method.

In both of the examples described below, it is assumed that each code word is constituted by two symbols. The minimum distance Lm after interleaving between two symbols which were initially consecutive is selected, in both examples, to be equal to three.

Figure 1:
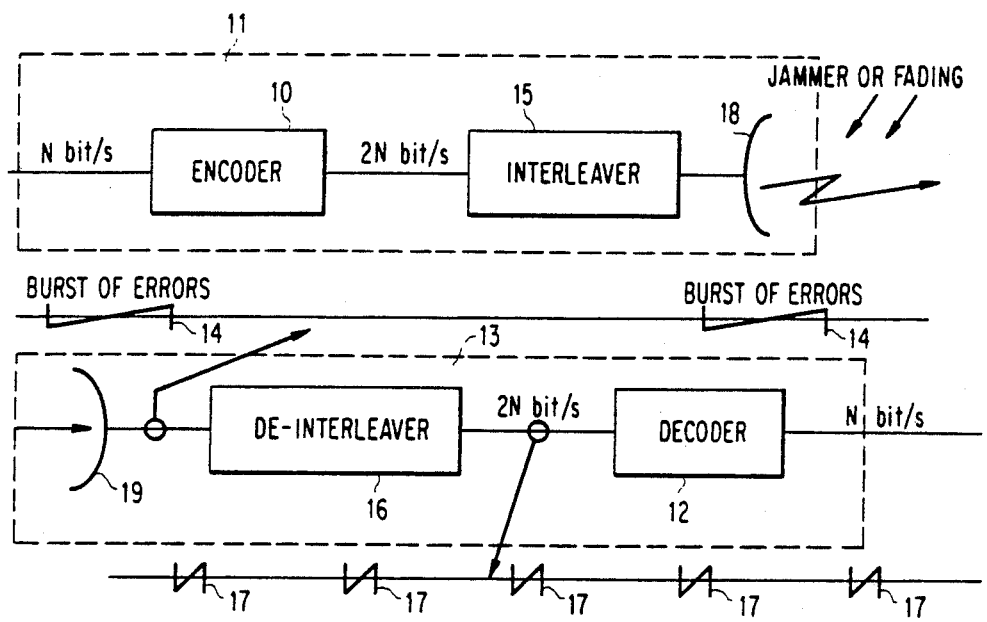
FIG. 1 shows a conventional transmitter/receiver system.
Figure 2:
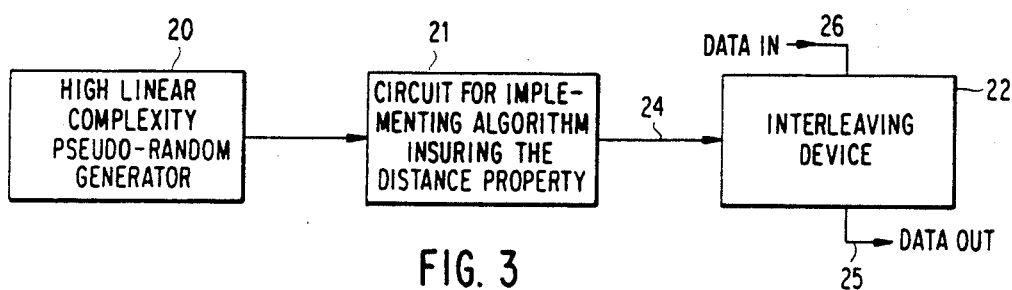
FIG. 2 shows an efficient pseudo-random interleaver according to the present invention.
Figure 3:
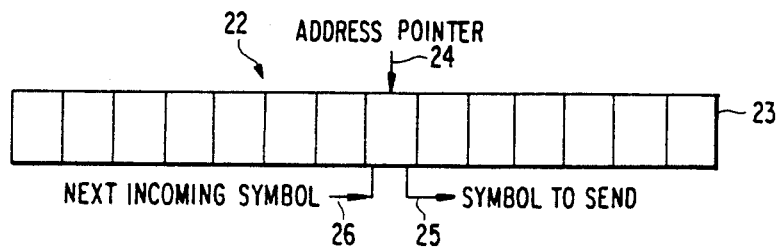
FIG. 3 shows the details of the interleaving device of FIG. 2.

The efficient pseudo-random interleaver of the present invention is shown in block diagram form in FIG. 2. The pseudo-random generator 20 generates the pseudo-random pilot sequence which is used in forming addresses. This pilot sequence is next sent to the block 21 which performs an algorithm on the pilot sequence which ensures the minimum distance property discussed above. More specifically, the algorithm performed by block 21 makes sure that the minimum distance Lm that may occur after interleaving between symbols which were initially consecutive in the same code word does not go below a certain value. Since the quality of interleaving is dependent upon this minimum value, the algorithm performed by the block 21 ensures that the quality of interleaving does not go below a minimum value. The outputs of the block 21 are sent as address pointers 24 to the interleaving device 22 which includes the register 23 as shown in detail form in FIG. 3.

The register 23 includes a plurality of spaces for accommodating data temporarily before it is sent into the transmission channel. The address information sent along the address pointer line 24 from the block 21 is used to decide which of the spaces in the register 23 is to be currently addressed. For each element of the pilot sequence generated by pseudo-random generator 20 and modified by the algorithm block 21, a unique address pointer is generated along line 24 and thus data stored in the register 23 is read out along the data out line 25 to be incorporated into the channel sequence for transmission. The data is immediately replaced at that same address pointed out by the address pointer with the next incoming symbol through data in line 26 to the register 23.

In the first example, a vector or register is selected whose size, Tv, is the minimum size i.e.:

$$Tv = Tc.Lm = 2 \times 3 = 6$$

The sequence of symbols to be transmitted as delivered by an upstream encoding device, is as follows:

a b c d e f g h i j k l m n o p q r s t u v w ...

The register is initially filled with the first six symbols to be transmitted: a b c d e f which are placed at register addresses 1 2 3 4 5 6, respectively.

The first address of the pilot sequence is selected at random from the six addresses of the register, e.g. 4.

Consequently, the content of address 4, i.e. the symbol d, is transmitted and thus constitutes the first symbol in the channel sequence. It is immediately replaced by the next symbol to be transmitted following the first six symbols, i.e. by the symbol g.

The contents of the register then becomes: a b c g e f. In accordance with the first above-defined law I, the content of address 4 may now no longer be transmitted until all the other addresses in the register have been selected. In addition, in accordance with the second law II, the other symbol of the same word, i.e. the symbol c may not be transmitted for the next two turns, so as to ensure that the above-defined minimum distance Lm is indeed equal to three.

Consequently, the next address in the pilot sequence is selected at random from the four available addresses, namely 1, 2, 5, and 6. The address 6 may be chosen, for example. The first two addresses of the pilot sequence are thus: 4 6.

It follows that the symbol f (to be found at address 6 in the register) is transmitted and thus constitutes the second symbol in the channel sequence, and that it is replaced in address 6 of the register by the eighth symbol to be transmitted, i.e. h.

The contents of the register then becomes: a b c g e h.

Given both the laws I and II:

neither of the addresses 4 or 6 is free to be selected so long as all four of the remaining addresses have not been selected;

address 5 cannot be selected until two turns have elaspsed; and address 3 cannot be selected until one turn has elasped.

The following address of the pilot sequence can therefore be chosen at random only between address 1 and address 2. Assume that address 1 is selected. The symbol a is transmitted and replaced by i.

The contents of the register becomes: i b c g e h.

The first law prevents any of addresses 1, 4, and 6 being selected. The second law prevents address 2 being selected for the next two turns, and address 5 for the next turn. Address 3 is therefore forced, after which address 5 is forced and finally address 2, and it should be observed in passing that no choice remains with respect to these last three addresses.

The way the first six addresses of the pilot sequence are obtained and the resulting channel sequence can thus be summed up in the following table:

| REGISTER | PILOT SEQUENCE | CHANNEL SEQUENCE |
|---|---|---|
| a b c d e f | 4 | d |
| a b c g e f | 6 | f |
| a b c g e h | 1 | a |
| i b c g e h | 3 | c |
| i b j g e h | 5 | e |
| i b j g k h | 2 | b |
| i l j g k h | | |

Now that all six addresses of the register have been selected one after the other, all six of them become available again. The new first address may be the address 3, for example, in which case the symbol j is transmitted and replaced by the symbol m. The symbol i may not be transmitted for two turns, such that address 1 may not be selected: a selection may be made between addresses 2, 4, 5, and 6. Assume address 2 is selected: the symbol l is transmitted and replaced by n. Addresses 2 and 3 are then forbidden by the first law, address 1 is still forbidden for one more turn, and address 5 for two more turns. A selection can be made only between address 4 and address 6. Assume address 4 is selected, for example, such that the symbol g is transmitted and replaced by o. No more choice remains for the next three turns: the following addresses must be taken in order: 1 (symbol i is transmitted and replaced by p); 5 (the symbol k is transmitted and replaced by q); and finally 6 (symbol h is transmitted and replaced by r).

The following six addresses of the pilot sequence (address 7 through address 12) and the resulting channel sequence are summed up in the following table.

| REGISTER | PILOT SEQUENCE | CHANNEL SEQUENCE |
|---|---|---|
| i l j g k h | 3 | j |
| i l m g k h | 2 | l |
| i n m g k h | 4 | g |
| i n m o k h | 1 | i |
| p n m o k h | 5 | k |
| p n m o q h | 6 | h |
| p n m o q r | | |

The pilot sequence thus begins as follows: 4 6 1 3 5 2 3 2 4 1 5 6, and the first 12 symbols to be transmitted are in the following order: d f a c e b j l g i k h. The minimum distance between initially consecutive words in the same initial code word is indeed three symbol lengths (i.e. there are at least two other symbols between a and b, between c and d, between e and f, etc. . . . ).

By way of illustration, the first eighteen addresses in the pilot sequence and the first eighteen symbols in the channel sequence resulting therefrom are summarized in the following table:

| REGISTER | PILOT SEQUENCE | CHANNEL SEQUENCE |
|---|---|---|
| a b c d e f | 4 | d |
| a b c g e f | 6 | f |
| a b c g e h | 1 | a |
| i b c g e h | 3 | c |
| i b j g e h | 5 | e |
| i b j g k h | 2 | b |
| i l j g k h | 3 | j |
| i l m g k h | 2 | l |
| i n m g k h | 4 | g |
| i n m o k h | 1 | i |
| p n m o k h | 5 | k |
| p n m o q h | 6 | h |
| p n m o q r | 5 | q |
| p n m o s r | 2 | n |
| p t m o s r | 1 | p |
| u t m o s r | 6 | r |
| u t m o s v | 3 | m |
| u t w o s v | 4 | o |
| u t w x s v | | |
| and so on . . . | | |

At the reception end, the inverse pilot sequence, and consequently deinterleaving, are obtained as follows:

The inverse pilot sequence is obtained by filling a receive register having the same size as the register used for transmission (six symbols) with the first six symbols transmitted in the above channel sequence.

The receive register is thus initially filled as follows:

d f a c e b

The first address in the inverse pilot sequence is the place for the "smallest" element then contained in the receive register (where "smallest element" is used to designate the symbol having the lowest order number in the sequence of symbols corresponding to the initial encoding, prior to the transmission interleaving); this smallest element is a and it is in the third position in the register: the inverse pilot sequence therefore begins with address 3.

The symbol a is then replaced by the following symbol in the channel sequence: i.e. j.

The receive register is then filled as follows:

d f j c e b

The smallest element therein, b, is in sixth place, such that the inverse pilot sequence continues with 6.

The register then contains:

d f j c e l

And so on, with the inverse pilot sequence being as follows:

3 6 4 1 5 2 . . .

and the receive register successively taking up the following states:

|  |
|---|
| d f a c e b |
| d f j c e b |
| d f j c e l |
| d f j g e l |
| i f j g e l |
| i f j g k l |
| i h j g k l |
| . . . |

The inverse pilot sequence is thus obtained after initially filling the receive register with the first six successive symbols of the channel sequence, by taking the address in said register of the smallest symbol and in simultaneously replacing that symbol with the following symbol in the channel sequence.

Clearly, if the inverse pilot sequence is already available and if the receive register is read from and refilled (after being initially filled with the first six symbols from the channel sequence) using the receive channel sequence, then the symbols will be returned to their initial order (prior to transmission interleaving).

For the first example as described above, in which:

$$Tv = Tc.Lm,$$

it should be observed that the second law is never transgressed, i.e. the minimum distance Lm between two symbols which were initially in succession in the same initial code word is always achieved. However, legally available pilot sequences are limited in number since, as shown above, for each series of six read/write operations on the transmit register, no choice remains from the fourth operation on.

In order to provide a sequence which is less easily predicted, and therefore more difficult for a possible enemy to attack, it is therefore appropriate to select:

$$Tv > Tc.Lm$$

and this is achieved in the second example described briefly below by selecting:

$$Tv = 8,$$

where Te and Lm remain respectively equal to 2 and 3, and with the encoded sequence of symbols to be transmitted likewise being the same.

The transmit register is thus initially filled as follows:

a b c d e f g h

The first address in the pilot sequence may be the address 3, for example. The symbol c is transmitted and replaced with i. Address 3 is no longer available, and address 4 is not available for the next two turns. The contents of the register becomes:

a b i d e f g h

The next choice may be 5, for example. The symbol e is transmitted and replaced by j. Addresses 3 and 5 are no longer available, address 4 is not available for the next turn, and address 6 is not available for the next two turns. The contents of the register is now:

a b i d j f g h

Four addresses remain available: 1, 2, 7, and 8. Assume 1 is selected: the symbol a is transmitted and replaced by k. The contents of the register then becomes:

k a j d e i g h

Addresses 5, 3, and 1 are no longer available; 4 has become available, 2 is not available for two more turns, and 6 is not available for one more turn.

There remain three possible addresses: 4, 7, and 8. Assume 4 is selected. The symbol d is transmitted and replaced by 1. The contents of the register becomes:

k a j l e i g h

Continuing in this way, the next address selected is 6, then 2, then 7.

It can then be seen that the first seven addresses are forbidden by the first law, whereas the eighth and last address is forbidden by the second law. The second law must therefore be transgressed by applying the third law III as defined above, in order to be able to continue and consequently select address 8 for the pilot sequence. Fortunately this is recovered by the fact that the error correcting code used is capable of correcting a plurality of errors. Finally, it may be observed that in order to obtain greater uncertainty than can be obtained using the minimum size of vector:

$$Tv = Tc.Lm:$$

it is appropriate to take a vector Tv which is slightly greater in size than the minimum size. In such a case, it is sometimes necessary to apply the third law which will not matter so long as the error correcting code used is capable of correcting a plurality of errors.

Naturally, the invention is not limited to the implementations described above. In particular, other methods may be designed for obtaining the inverse pilot sequence.

We claim:

1. A method of pseudo-random interleaving for a digital data transmission system, wherein the method consists in:

using a vector whose size is not less than the size of a code word multiplied by the minimum predetermined distance after interleaving between two symbols initially belonging to the same code word, in initially filling this vector with the series S1 of the first Tv symbols of the sequence of code words, then, at each of the addresses of said vector given one after the other by a pseudo-random pilot sequence, taking the symbol from that address to incorporate it into the channel sequence for transmission, and immediately replacing it at said address with the following symbol in code word order taken from the series S2 of the following Tv symbols, until all of the symbols of said first series S1 have been taken one after the other and replaced by all of the symbols of said second series S2, and then in repeating the process, by taking all of the symbols of said second series S2 in the same manner in a pseudo-random order specified by said pilot sequence, replacing each of them in turn in said vector with symbols taken in order from the third series S3 of the following Tv symbols in code word order, and so on until all of the words have been incorporated in said channel sequence:

said pilot sequence being established, pseudo-randomly by obeying the three following laws:

(I) no address in the vector may be selected more than once while transmitting the symbols of a series Sn and replacing them in the vector with the symbols of a series Sn+1;

(II) once one of these addresses n has been selected, any other address in the vector that contains another symbol in the same code word as the code word that contains the symbol found at the address n when said address was selected may not itself be selected until Lm turns later; and (III) if blocking occurs, i.e. if an address cannot be selected without transgressing one or other of the two preceding laws, then an address is selected which does not transgress the first law I, even if it does transgress the second law II;

and, on reception, the received signal sequence is deinterleaved by using another vector of the same size Tv as the vector used on transmission, said vector being initially filled in successive addresses with the first Tv symbols from the channel sequence in the order in which they are received, after which, in the same manner as at the transmission end, the symbols are simultaneously read from the vector and replaced by the following symbols of the channel sequence at successive addresses given by an inverse pilot sequence determined so that the symbols read in this way one after the other are in the initial order of the encoded symbols before interleaving.

2. A method according to claim 1, wherein the inverse pilot sequence is obtained on each occasion by selecting the address in said vector of the symbol having the lowest order number in the sequence of symbols corresponding to the initial coding.

* * * * *